(12) United States Patent
Umezawa

(10) Patent No.: US 7,577,032 B2
(45) Date of Patent: Aug. 18, 2009

(54) NON-VOLATILE SEMICONDUCTOR MEMORY DEVICE

(75) Inventor: Akira Umezawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 105 days.

(21) Appl. No.: 11/924,133

(22) Filed: Oct. 25, 2007

(65) Prior Publication Data

US 2008/0123424 A1  May 29, 2008

(30) Foreign Application Priority Data

Oct. 26, 2006 (JP) ............................. 2006-291557

(51) Int. Cl.
*G11C 11/03* (2006.01)
(52) U.S. Cl. ...................... 365/185.13; 365/185.05; 365/185.07; 365/185.14
(58) Field of Classification Search ............ 365/185.13, 365/185.05, 185.07, 185.14
See application file for complete search history.

(56) References Cited

U.S. PATENT DOCUMENTS 6,958,940 B2 * 10/2005 Takase et al. .......... 365/185.29

7,177,190 B2 * 2/2007 Lee ........................ 365/185.17

FOREIGN PATENT DOCUMENTS

JP     2000-49312     2/2000

* cited by examiner

*Primary Examiner*—Pho M. Luu
(74) *Attorney, Agent, or Firm*—Oblon, Spivak, McClelland, Maier & Neustadt, P.C.

(57) ABSTRACT

The local row decoder includes a first MOS transistor of a first conductivity type having one end connected to the local word line, the other end supplied with a first voltage, and a gate connected to the global word line, and a second MOS transistor of a second conductivity type having one end connected to the local word line, the other end supplied with a second voltage, and a gate connected to the global word line. The global row decoder is capable of independently selecting either a first global word line or a second global word line. The first global word line is connected to the first MOS transistor and the second MOS transistor both connected to any one of the local word lines. The second global word line is connected to the first MOS transistor and the second MOS transistor both connected to another adjacent local word line.

12 Claims, 9 Drawing Sheets

FIG. 8  READ

NON-VOLATILE SEMICONDUCTOR MEMORY DEVICE

CROSS-REFERENCE TO RELATED APPLICATION

This application is based upon and claims the benefit of priority from prior Japanese Patent Application No. 2006-291557, filed on Oct. 26, 2006, the entire contents of which are incorporated herein by reference.

BACKGROUND OF THE INVENTION

1. Field of the Invention

The present invention relates to a non-volatile semiconductor memory device including an array of electrically erasable programmable non-volatile memory cells.

2. Description of the Related Art

Conventionally known non-volatile semiconductor memory devices include NOR-type flash memories and NAND-type flash memories. In such the flash memories, a memory cell is selected when a row decoder selects a word line. The row decoder may be configured as proposed variously (see JP 2000-49312A, for example).

In the conventional flash memories, the row decoder has a larger size, which causes interference with downsizing the flash memories. Particularly, in the NOR-type flash memory, while a non-selected word line is brought into a floating state, capacitive coupling thereof with other word lines elevates the potential on the non-selected word line, which may cause failed read. Therefore, the row decoder also inevitably requires a configuration to prevent this problem though such the configuration increases the number of elements and the number of wires correspondingly, which may cause interference with downsizing.

SUMMARY OF THE INVENTION

In one aspect the present invention provides a non-volatile semiconductor memory device, comprising: a memory cell array of electrically erasable programmable non-volatile memory cells arrayed at intersections of local word lines and local bit lines; a local row decoder configured to select one of the local word lines in accordance with an address signal; and a global row decoder configured to select one of global word lines, which is to be connected to the local row decoder, in accordance with an address signal, wherein the local row decoder includes a first MOS transistor of a first conductivity type having one end connected to the local word line, the other end supplied with a first voltage, and a gate connected to the global word line, and a second MOS transistor of a second conductivity type different from the first conductivity type having one end connected to the local word line, the other end supplied with a second voltage, and a gate connected to the global word line, wherein the global row decoder is capable of independently selecting either a first global word line or a second global word line such that one is selected while the other is not selected, the first global word line being connected to the first MOS transistor and the second MOS transistor both connected to any one of the local word lines, and the second global word line being connected to the first MOS transistor and the second MOS transistor both connected to another adjacent local word line.

DETAILED DESCRIPTION OF THE EMBODIMENTS

The embodiments of the present invention will now be described in detail with reference to the drawings.

Figure 1:
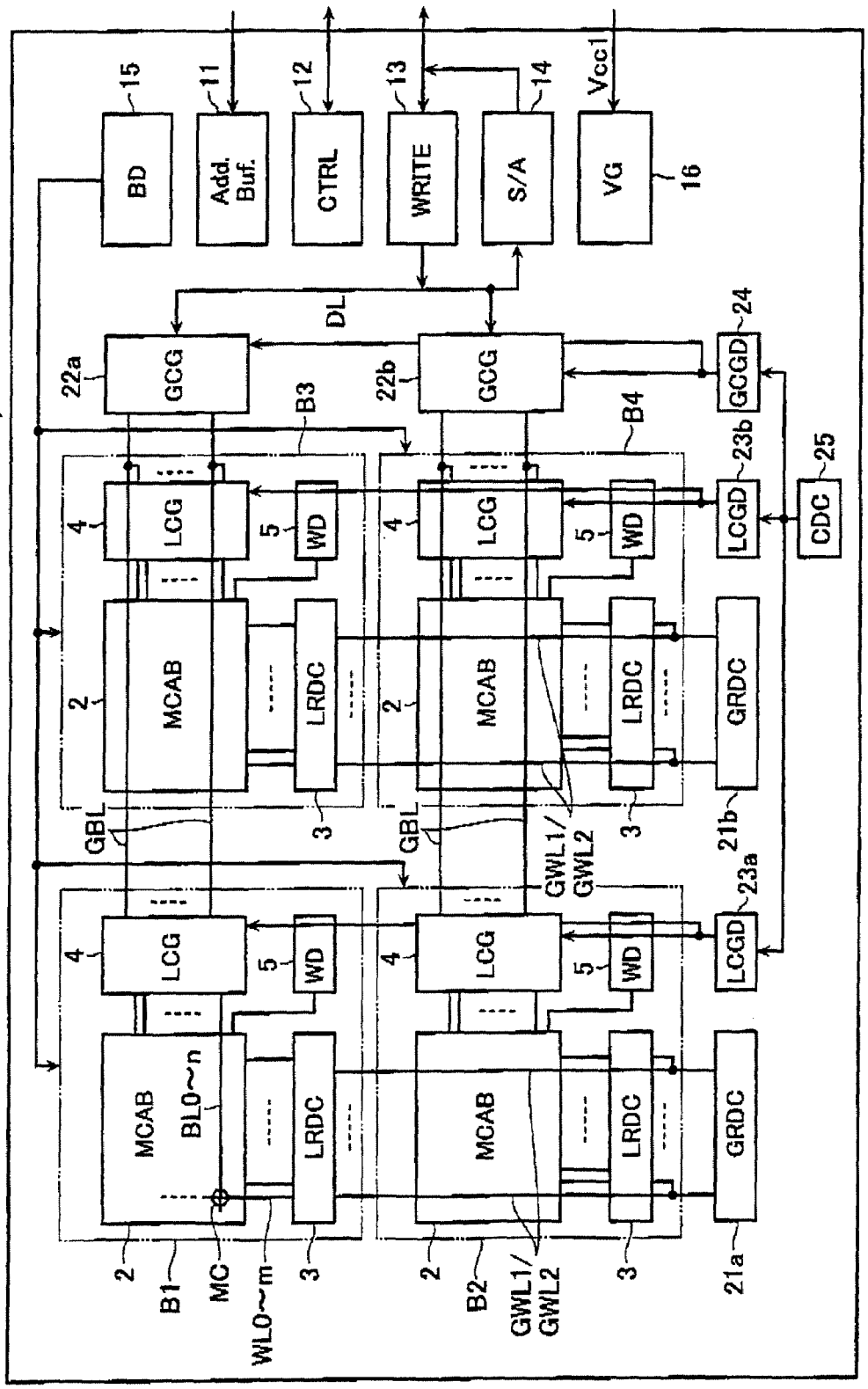
FIG. 1 is a block diagram showing the whole configuration of a non-volatile semiconductor memory device according to an embodiment of the present invention.

FIG. 1 is a block diagram showing a structure of a non-volatile semiconductor memory device 1 according to an embodiment of the present invention.

The non-volatile semiconductor memory device 1 has four memory core sections B1-B4. The memory core sections B1-B4 each include a memory cell array 2, a local decoder 3, a local column gate 4, and a well decoder 5.

Figure 2:
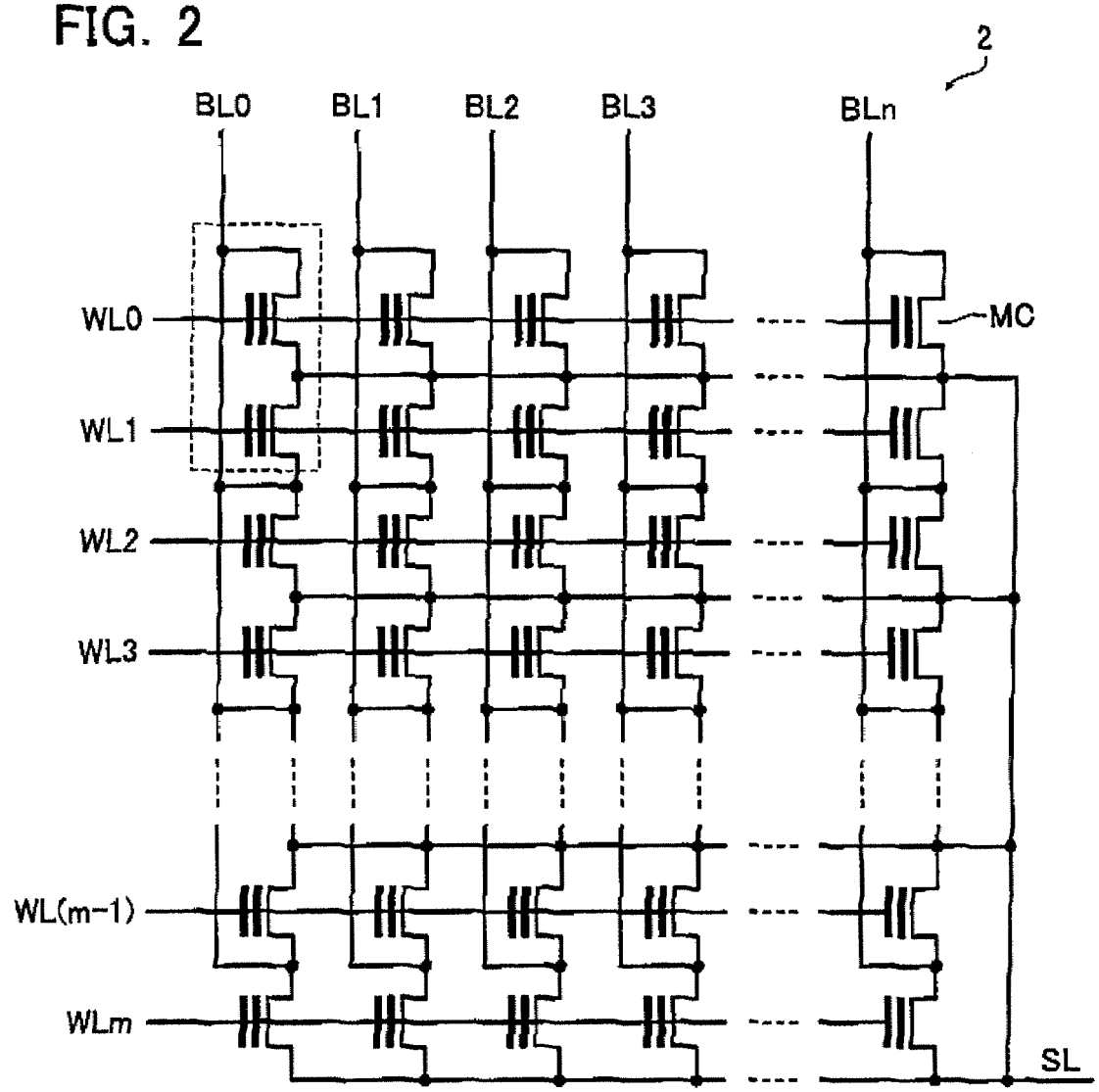
FIG. 2 is an equivalent circuit diagram of a memory cell array 2 in FIG. 1.

As shown in a equivalent circuit diagram in FIG. 2, the memory cell array 2 includes a number of memory cells MC arrayed at intersections of word lines (local word lines) WL0-WLm and bit lines (local bit lines) BL0-BLn. The memory cell MC herein is a non-volatile memory cell of the so-called stacked-gate type that has a floating gate formed on a semiconductor substrate with a gate insulator interposed therebetween, and a control gate formed on the floating gate with a gate insulator interposed therebetween as described later. The memory cells MC arranged in the same row have respective control gates, which are commonly connected to any one of the word lines WL0-WLm. The memory cells MC arranged in the same column have respective drains, which are commonly connected to any one of the bit lines BL0-BLn. The memory cells MC have respective sources, which are commonly connected to source lines SL to complete a NOR-type flash memory including plural memory cell transistors connected in parallel with one bit line BL. In the structure of FIG. 2, two adjacent memory cells MC (shown with the dotted line) are formed to share a source line SL.

Figure 3:
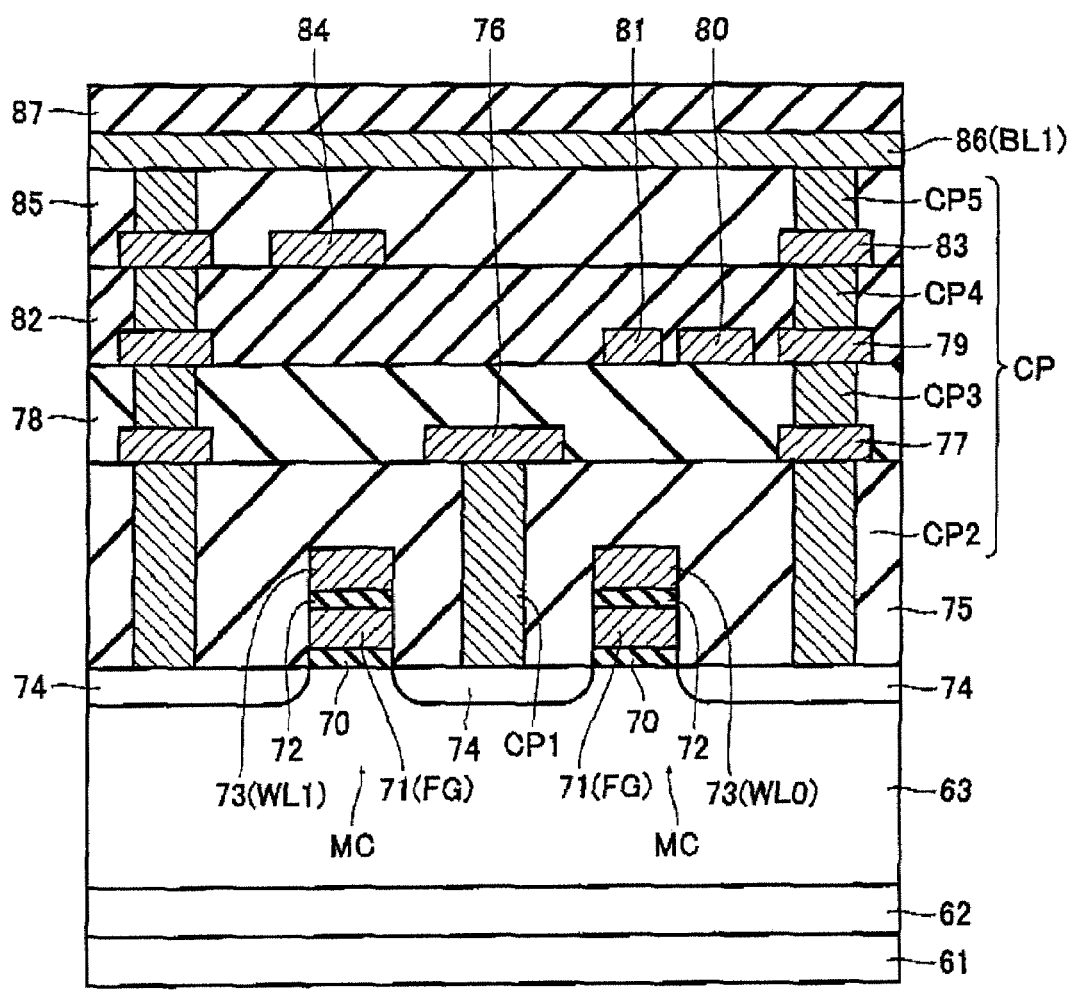
FIG. 3 shows a cross-sectional view of two memory cells MC that share a source line SL.

FIG. 3 shows a cross-sectional view of two memory cells MC that share the source line SL. As shown in FIG. 3, on a p-type semiconductor substrate 61, an n-type well region 62 and a p-type well region 63 are formed in turn to form memory cells MC in the p-type well region 63. A memory cell MC includes a gate electrode composed of a gate insulator 70, a floating gate 71, a gate insulator 72, and a control gate 73 stacked in this order on the surface of the p-type well region 63. At every memory cell MC, the floating gate 71 is electrically separated from others. On the other hand, the control gate 73 is commonly connected to others in plural memory cells MC in the same row (the direction perpendicular to the page of FIG. 3) to form a word line WL.

In the surface of the p-type well region 63 between the gate electrodes, a diffused layer 74 is formed to serve as sources/drains of the memory cells MC. The diffused layer 74 is shared among plural memory cells MC.

The memory cells MC, including the gate electrodes, are covered in an interlayer insulator 75, which is formed over the p-type well region 63. Contact plugs CP1, CP2 are formed through the interlayer insulator 75 to reach respective portions of the diffused layer 74. The contact plug CP1 connected to a portion (source region) of the diffused layer 74 shared between two memory cells MC is connected to a metal wiring layer 76. The metal wiring layer 76 is formed on the surface of the interlayer insulator 75 and serves as the source line SL. A metal wiring layer 77 is also formed on the surface of the interlayer insulator 75 and brought into contact with the contact plug CP2. An interlayer insulator 78 is formed over the surface of the interlayer insulator 75 to cover the metal wiring layers 76, 77. A contact plug CP3 is formed through the interlayer insulator 78 to reach the metal wiring layer 77.

Metal wiring layers 79, 80, 81 are formed on the surface of the interlayer insulator 78. The metal wiring layer 79 is formed as connected to the contact plug CP3. The metal wiring layers 80, 81 serve as global word lines GWL.

A further interlayer insulator 82 is deposited to cover the metal wiring layers 79-81. A contact plug CP4 is formed through the interlayer insulator 82 to reach the metal wiring layer 79. Metal wiring layers 83, 84 are formed on the surface of the interlayer insulator 82, and an interlayer insulator 85 is formed over the interlayer insulator 82. A contact plug CP5 is formed through the interlayer insulator 85 to reach the metal wiring layer 83. A metal wiring layer 86 is formed on the surface of the interlayer insulator 85 as connected to the contact plug CP5. The metal wiring layer 86 is used as the bit line BL. Namely, the contact plugs CP2, CP4, CP5 and the metal wiring layers 77, 79, 83 serve as a contact plug CP for bit line wiring. A further interlayer insulator 87 is formed to cover the metal wiring layer 86.

Returning to FIG. 1, the local row decoder 3 has a role of selecting among the word lines WL in accordance with a row address fed from external. The local column gate 4 has a role of selecting any one of the bit lines BL and connecting the bit line to the global bit line GBL. The well decoder 5 is operative to apply a well voltage for data erase to the well region in which the memory cell array 2 is formed.

The non-volatile semiconductor memory device 1 comprises an address buffer 11, a controller 12, a write circuit 13, a sense amp 14, a block decoder 15 and a voltage generator 16 as the configuration for executing operations of program, read, erase and so forth to the memory core sections B1-B4.

The address buffer 11 has a function of receiving a signal from external and temporarily storing it. The controller 12 controls the whole of the non-volatile semiconductor memory device 1. The write circuit 13 receives the input of write data to be written in the memory cell array 2 from external and executes write. The sense amp 14 senses and amplifies data read out of a memory cell MC. The voltage generator 16 generates various voltages required for data program, read and erase based on a supply voltage Vcc1.

The non-volatile semiconductor memory device 1 also comprises global row decoders 21a, 21b, global column gates 22a, 22b, local column gate drivers 23a, 23b, a global column gate driver 24, and a column decoder 25.

The global row decoder 21a has a role of selecting a local row decoder 3 in the memory core section B1 or B2 in accordance with an address signal fed from the address buffer 11.

The global row decoder 21b has a role of selecting a local row decoder 3 in the memory core section B3 or B4 in accordance with an address signal fed from the address buffer 11.

The global column gates 22a, 22b are connected via a data line DL to the write circuit 13 and the sense amp 14 and configured to be selectively driven by the column decoder 25 and the global column gate driver 24. The global column gate 22a is provided corresponding to the memory core sections B1 and B2. The global column gate 22b is provided corresponding to the memory core sections B3 and B4.

The local column gate drivers 23a, 23b select among local column gates 4 arranged in the memory core sections B1-B4 in accordance with a column address signal fed from the address buffer 11. The local column gate driver 23a is provided corresponding to the memory core sections B1 and B2. The local column gate driver 23b is provided corresponding to the memory core sections B3 and B4.

On data program, write data fed from the write circuit 13 is provided to the driven global column gate 22a or 22b, and thus the write data is provided to the local column gate 4 selected by the local column gate driver 23a, 23b. On data read, the global column gate 22a, 22b has a role of feeding the data to the sense amp 14, which is read out of a memory cell MC in the selected memory cell array 2 via the local column gate 4.

Figure 4:
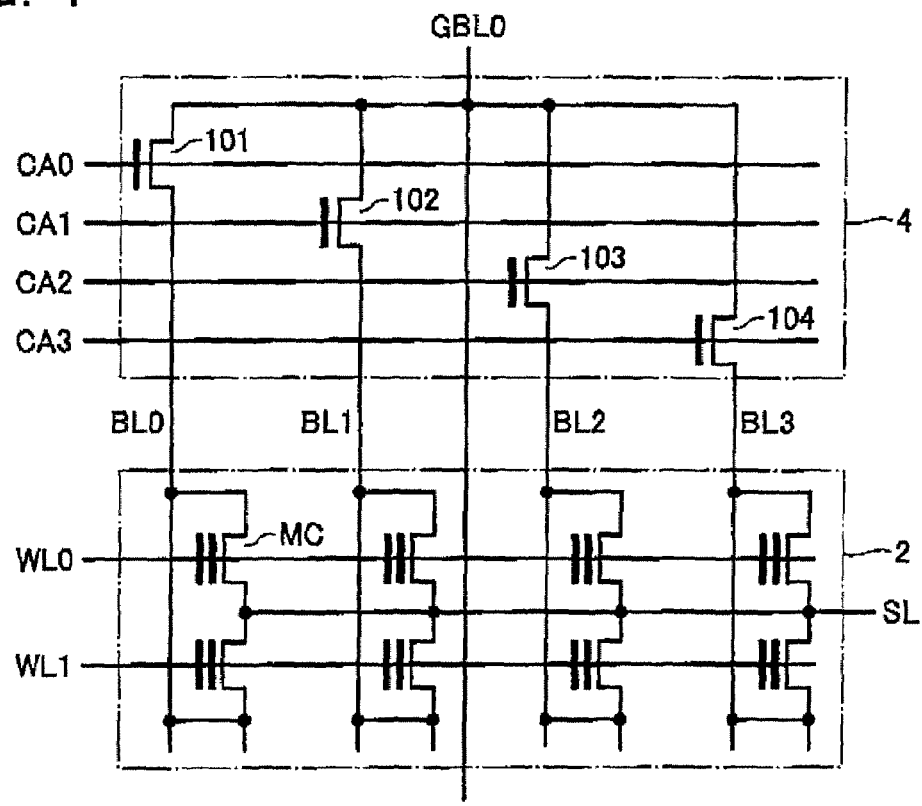
FIG. 4 is an equivalent circuit diagram showing a configuration example of a local column gate 4 in FIG. 1.
Figure 5:
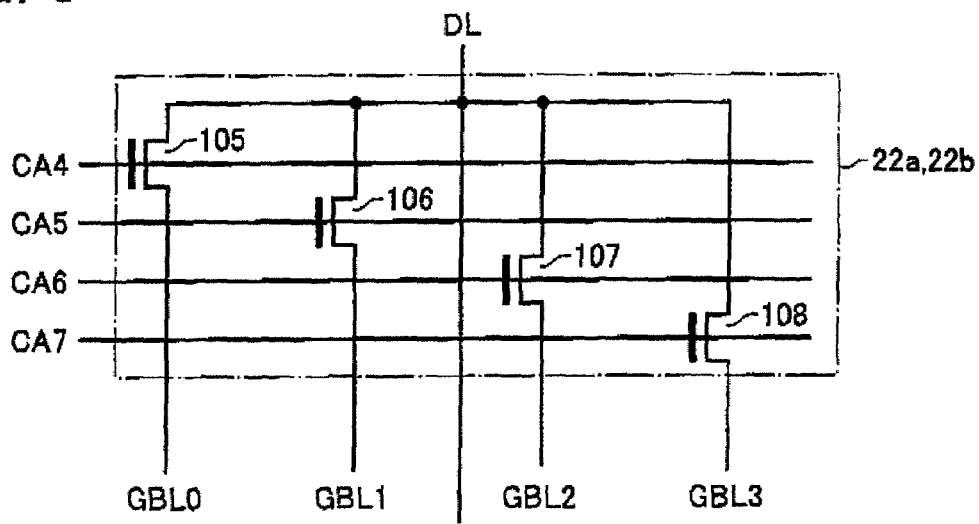
FIG. 5 is an equivalent circuit diagram showing a configuration example of global column gates 22a, 22b in FIG. 1.

FIG. 4 shows a configuration example of the local column gate 4, and FIG. 5 shows a configuration example of the global column gates 22a, 22b. The local column gate 4 includes four n-channel MOS transistors 101-104. These MOS transistors 101-104 have respective gates, which receive lower 4-bit signals CA0-CA3 of 8-bit column address signals CA0-CA7, for example, thereby selecting any one of the bit lines BL0-BL3.

The global column gate 22a and 22b each include four n-channel MOS transistors 105-108 as shown in FIG. 5. These MOS transistors 105-108 have respective gates, which receive upper 4-bit signals CA4-CA7 of 8-bit column address signals CA0-CA7, for example, thereby selecting any one of the global bit lines BL0-BL3.

Figure 6:
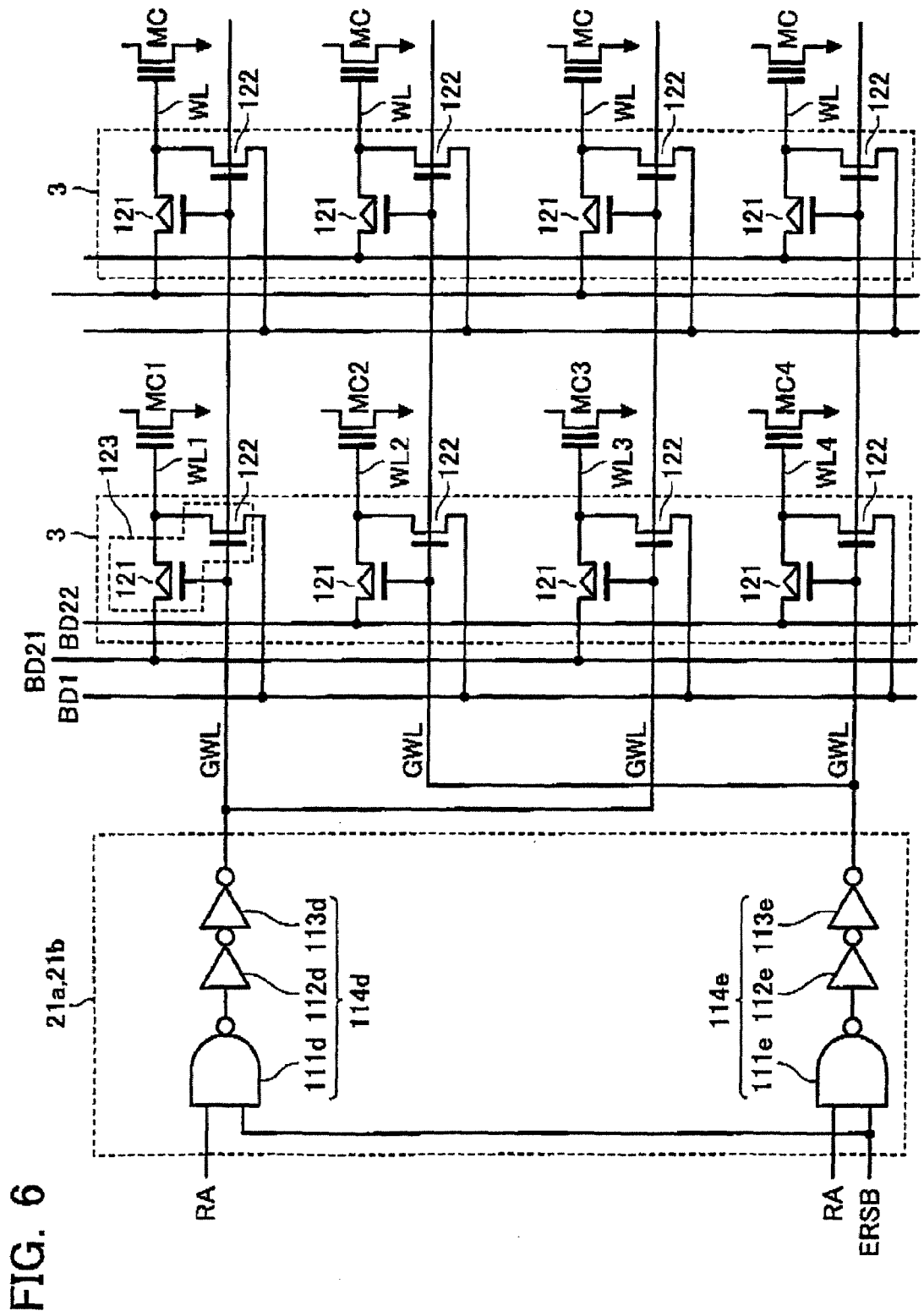
FIG. 6 is an equivalent circuit diagram showing a configuration example of global row decoders 21a, 21b and local row decoders 3 in FIG. 1.

A configuration example of the global row decoder 21a, 21b and the local row decoder 3 is described next with reference to FIG. 6. The global row decoder 21a includes a first decoding circuit 114d and a second decoding circuit 114e. The first decoding circuit 114d includes a row address decoding circuit 111d and inverters 112d and 113d. The second decoding circuit 114e includes a row address decoding circuit 111e and inverters 112e and 113e.

The first decoding circuit 114d is used to select plural odd-numbered global bit lines GWL by one operation in accordance with a row address RA. On the other hand, the second decoding circuit 114e is used to select plural even-numbered global bit lines GWL by one operation in accordance with a row address RA. In addition to the row address RA, the row address decoding circuits 111d, 111e also receive a signal ERSB, which is at "L" only on execution of an erase sequence and at "H" in other cases.

The local row decoder 3 includes selection switches 123, each of which is composed of a p-channel MOS transistor 121 and an n-channel MOS transistor 122 and connected to each word line WL. The p-channel MOS transistor 121 has a drain and the n-channel MOS transistor 122 has a source, both connected to the same word line WL. The p-channel MOS transistor 121 and the n-channel MOS transistor 122 connected to a common word line WL have respective gates, which are commonly connected to a single global word line GWL.

The n-channel MOS transistor 122 has a drain, which is connected to a first block decoding wire BD1, On the other hand, the p-channel MOS transistor 121 has a source, which is connected to a second block decoding wire BD21 or BD22. The first block decoding wire BD1 is supplied with a voltage of 0V on data read. On the other hand, the second block decoding wire BD21 or BD22 is supplied with a voltage of 5V on data read. In addition, on data write and erase, the voltage value is switched as described later.

The p-channel MOS transistor 121 connected to an odd-numbered word line WL is connected to the second block decoding wire BD21 while the p-channel MOS transistor 121 connected to an even-numbered word line WL is connected to the second block decoding wire BD22.

The potentials on the second block decoding wires BD21 and BD22 are switched by the block decoder 15 in response to the selection at the global row decoder 21a or 21b. Thus, the local row decoder 3 of the present embodiment includes two transistors 121, 122 formed for each single word line WL. Accordingly, the row decoder can be downsized. In addition, even if downsized in this way, and a non-selected word line is brought into a floating state, it causes no failed read, as described later.

COMPARATIVE EXAMPLE

Figure 7:
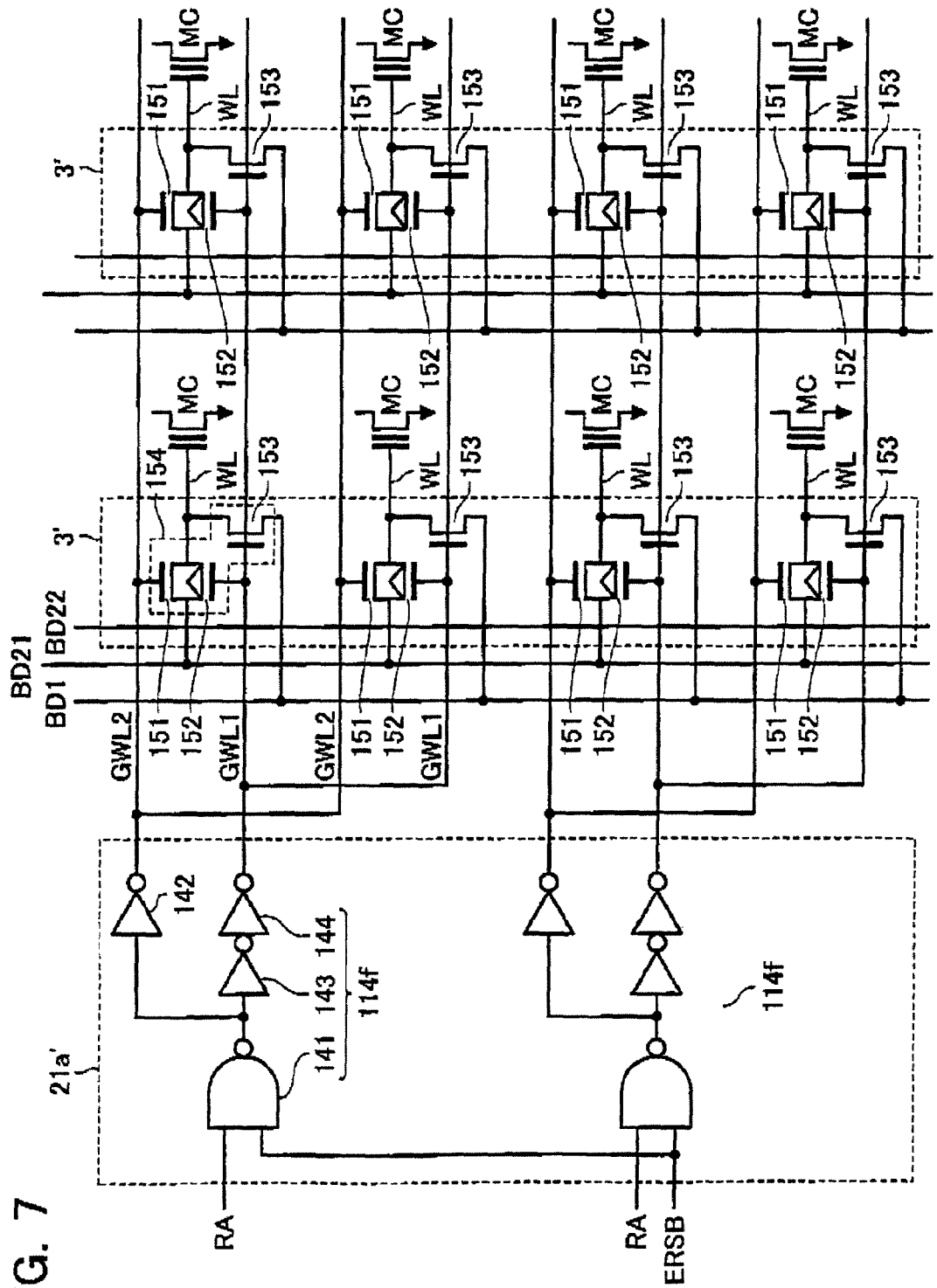
FIG. 7 shows a configuration example of a conventional row decoder as a comparative example.

A conventional row decoder is exemplified in FIG. 7 as a comparative example. In this example, a global row decoder 21a' includes decoding circuits 114f each provided for every two word lines WL. Each of the decoding circuits 114f is configured to select a set of a first global word line GWL1 and a second global word line GWL2. Each decoding circuit 114f includes an NAND gate 141, and inverters 142-144.

The NAND gate 141 serves as a decoding circuit operative to decode a row address signal RA. In addition to the row address RA, the NAND gate 141 also receives a signal ERSB, which is at "L" only on execution of an erase sequence and at "H" in other cases. The inverter 142 is connected between the output of the NAND gate 141 and the second global word line GWL2. The inverters 143 and 144 are serially connected between the output of the NAND gate 141 and the first global word line GWL1.

A row decoder 3' includes an n-channel MOS transistor 151, a p-channel MOS transistor 152 and an n-channel MOS transistor 153, which configure a selection switch 154 connected to each word line WL.

The n-channel MOS transistor 151 and the p-channel MOS transistor 152 are connected in parallel to configure a CMOS gate, which has one end (output side) connected to the word line WL and the other end (input side) connected to the second block decoding wire BD21 or BD22. The n-channel MOS transistor 151 has a gate connected to the second global word line GWL2 while the p-channel MOS transistor 152 has a gate connected to the first global word line GWL1.

The n-channel MOS transistor 153 has a gate connected to the first global word line GWL1 and a source connected to the first block decoding wire BD1.

The device of FIG. 7 includes the n-channel MOS transistors 151 to prevent an occurrence of failed read when a non-selected word line is brought into a floating state. Therefore, the device includes a large number of elements, which may cause interference with downsizing the row decoder.

In contrast, the present embodiment is not provided with the n-channel MOS transistors 151 and the row decoder can be downsized correspondingly. The above-described problem associated with failed read in the floating state can be solved by the following configuration. Namely, the first decoding circuit 114d operative to select odd global bit lines GWL and the second decoding circuit 114e operative to select even-numbered global bit lines GWL are provided so that adjacent global bit lines can be selected independently.

[Operations]

Figure 9:
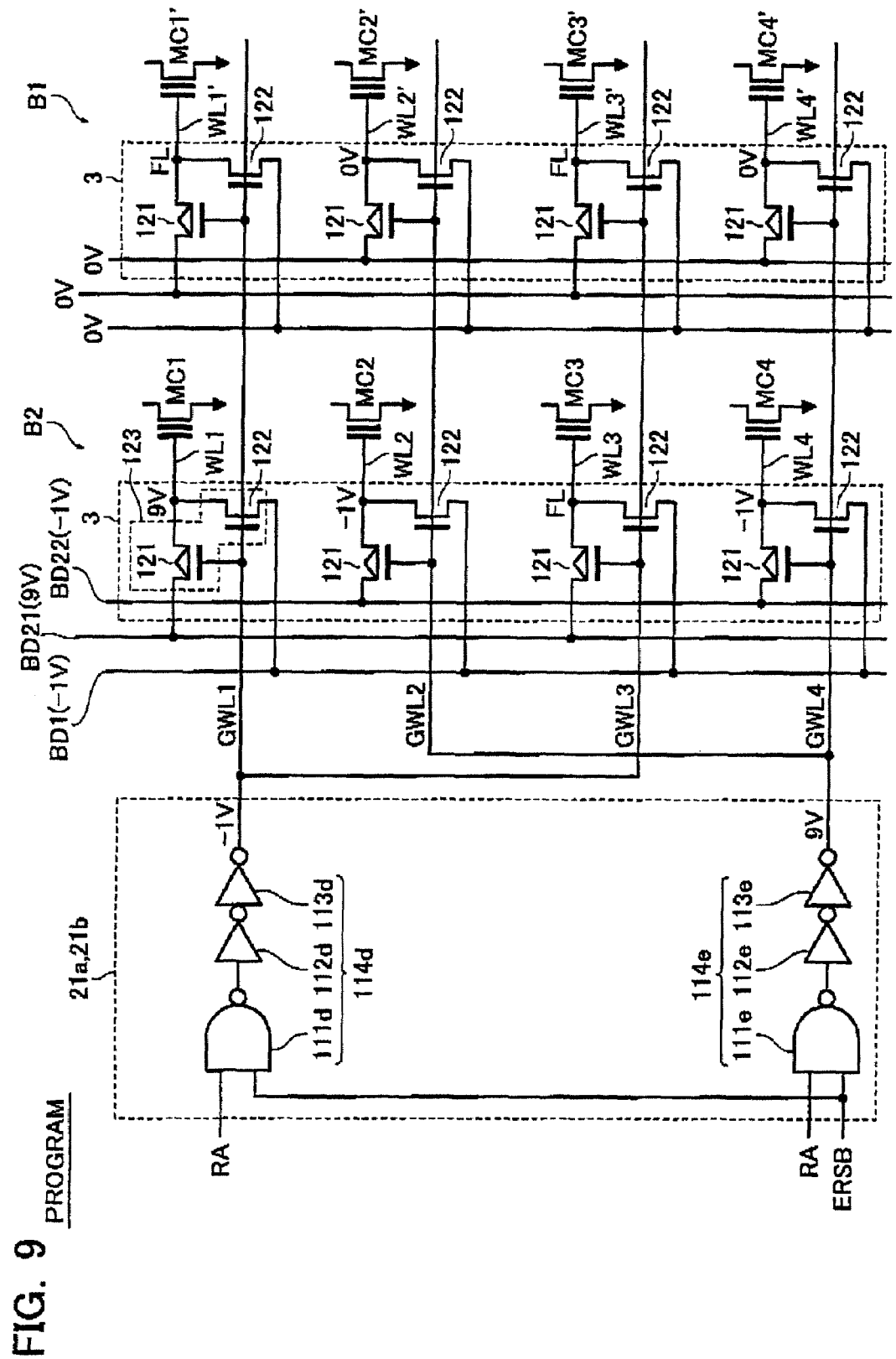
FIG. 9 illustrates a program operation in the non-volatile semiconductor memory of the present embodiment.
Figure 10:
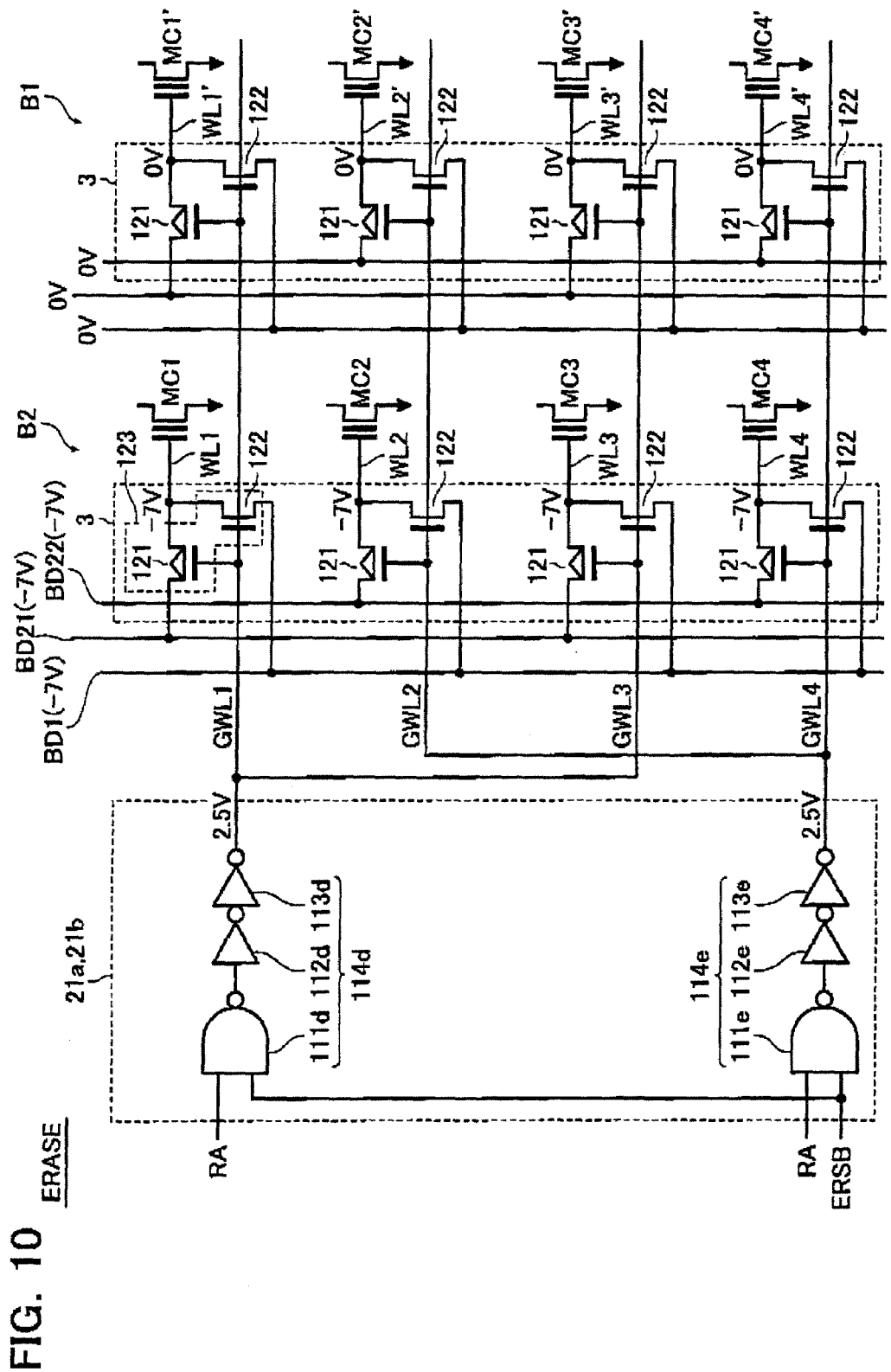
FIG. 10 illustrates an erase operation in the non-volatile semiconductor memory of the present embodiment.

Operations of the first embodiment are described next with reference to FIGS. 8-10.

[Read]

A read operation in the non-volatile semiconductor memory device of the present embodiment is described first.

Figure 8:
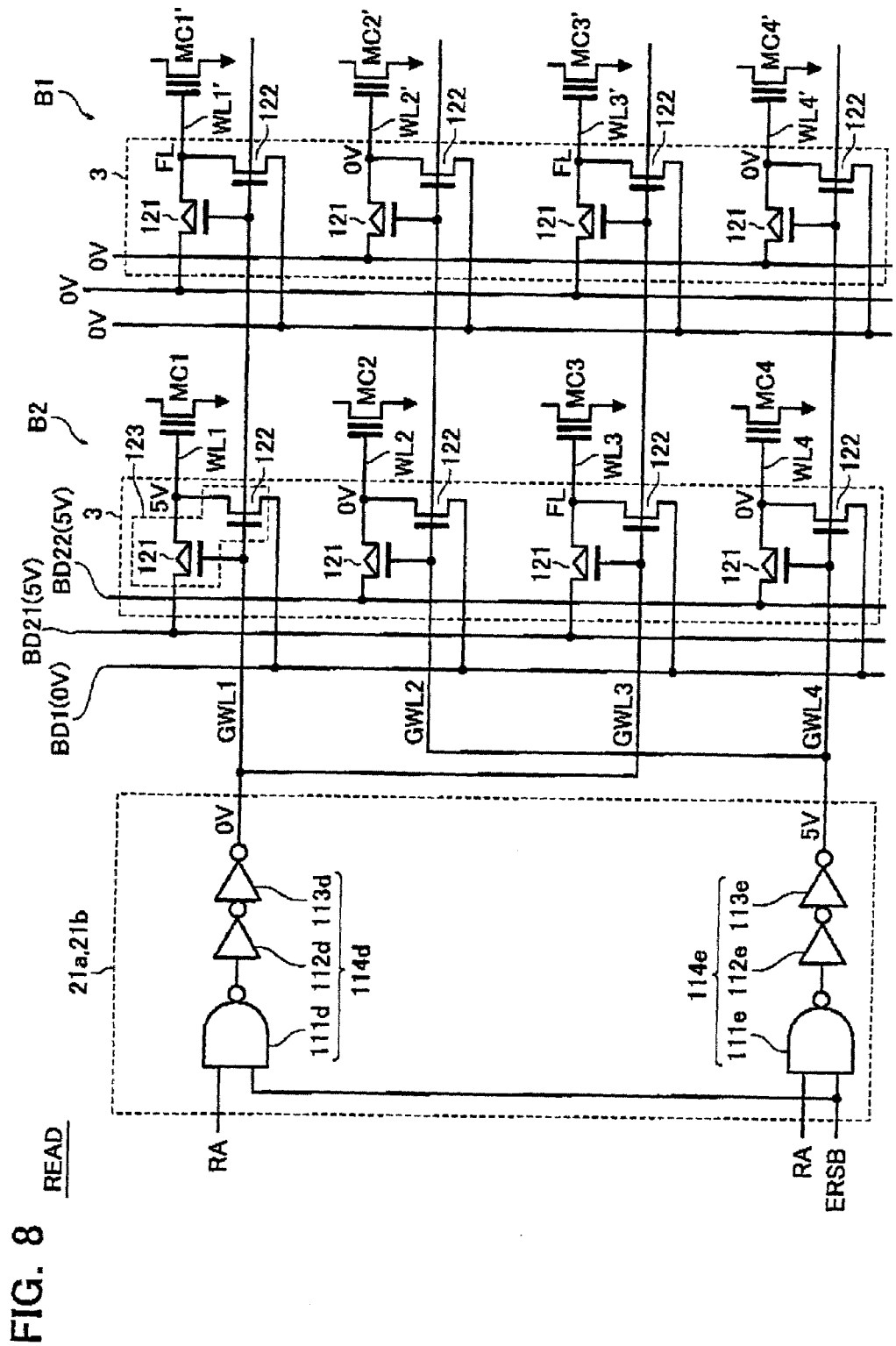
FIG. 8 illustrates a read operation in the non-volatile semiconductor memory of the present embodiment.

It is assumed herein that data is read out of a memory cell MC1 arrayed along an odd-numbered word line WL1 in FIG. 8. In this case, odd-numbered global word lines including a global word line GWL1 corresponding to the word line WL1 is supplied with a voltage of 0V from the first decoding circuit 114d. The first block decoding wire BD1 is supplied with 0V and the second block decoding wires BD21, BD22 are supplied with 5V. Thus, the p-channel MOS transistor 121 turns on and applies 5V to the word line WL1. The bit line BL connected to the memory cell MC is supplied with 1V. In accordance with the status that the data programmed in the memory cell MC1 is "1" or "0", the memory cell MC1 is brought into conduction or out of conduction. Accordingly, sensing the variation in potential on the bit line BL at the sense amp 18 can achieve data read.

On the other hand, the second decoding circuit 114e applies a voltage of 5V to even-numbered global word lines GWL. Therefore, 0V is applied to even-numbered word lines WL.

In such the voltage-applied state, the odd-numbered word line WL3 is brought into the floating state. In the present embodiment, however, adjacent even-numbered word lines WL1, WL3 are kept at 0V. Accordingly, capacitive coupling with these word lines causes no rise in potential on the word line WL3 and therefore causes no failed read.

Also in the memory cell array 2 in the non-selected block B1 (the block decoding wires BD1, BD21, BD22 are all kept at a voltage of 0V), odd-numbered word lines WL1', WL3' are brought into the floating state. Also in this case, even-numbered word lines WL2', WL4' adjacent to the floated odd-numbered word lines WL1', WL3' can be kept at the ground potential (0V). Therefore, even the non-selected block causes no problem associated with failed read based on the floated word line. Such the operation is made possible because odd-numbered global word lines and even-numbered global word lines can be controlled independently by the first decoding circuit 114d and the second decoding circuit 114e in the global row decoder 21a.

[Program]

A program operation in the non-volatile semiconductor memory device of the present embodiment is described next with reference to FIG. 9. It is assumed herein that data "0" is programmed in the memory cell MC1 arrayed along the odd-numbered word line WL1 in FIG. 9. In this case, the global word line GWL1 corresponding to the word line WL1 is supplied with −1V from the first decoding circuit 114d. The first block decoding wire BD1 is supplied with −1V and the second block decoding wires BD21 and BD22 are supplied with 9V and −1V, respectively.

In this case, the p-channel MOS transistor 121 turns on and applies a write voltage of 9V to the word line WL1. The voltage on the local bit line BL connected to the memory cell MC1 is controlled in accordance with write data. Namely, the local bit line BL is supplied with 5V when data "0" is programmed while the local bit line BL is supplied with 0V when data "1" is programmed (that is, when the threshold in the memory cell MC1 is not varied). The bit line BL connected to the non-selected memory cell array is still kept at 0V.

In such the voltage-applied state, among the non-selected word lines WL2-WL4, the odd-numbered word line WL3 is brought into the floating state. In the present embodiment, however, adjacent even-numbered word lines WL1, WL3 are supplied with −1V by the decoding circuit 114e and then channel MOS transistors 122. Accordingly, capacitive coupling with these word lines causes no rise in potential on the word line WL3 and therefore causes no malfunction such as failed write.

The memory cell array 2 in the non-selected block B1 (the block decoding wires BD1, BD21, BD22 are all kept at 0V) also allows floated word lines (WL1', WL3'). Also in this case, even-numbered word lines WL2', WL4' adjacent to the floated word lines can be kept at the ground potential (0V).

Therefore, even the non-selected block causes no problem associated with malfunctions based on the floated word line. Such the operation is made possible because odd-numbered global word lines and even-numbered global word lines can be controlled independently by the first decoding circuit 114d and the second decoding circuit 114e in the global row decoder 21a.

[Erase]

An erase operation in the non-volatile semiconductor memory device of the present embodiment is described next with reference to FIG. 10. Data erase is executed over the memory cell array by one operation. It is assumed herein that data erase is executed over the memory cells MC1-MC4 in the block B2 in FIG. 10. In this case, all odd/even global word lines GWL are supplied with 2.5V and the first block decoding wire BD1 and the second block decoding wires BD21, BD22 are supplied with −7V. The p-type well region 61 and the n-type well region 62 in the selected memory cell array are supplied with 11V from the well decoder 5. The bit line SL and the source line SL are brought into the floating state.

In this case, the n-channel MOS transistors 122 turn on and apply an erase voltage of −7V therethrough to the word lines WL1-WL4.

In the memory cell array 2 in the non-selected block B1 (the block decoding wires BD1, BD21, BD22 are all kept at 0V), the word lines WL1'-WL4' are all kept at the ground potential (0V) to inhibit data erase.

The embodiments of the invention are described above though the present invention is not limited to these embodiments but rather can be given various modifications, additions and so forth without departing from the scope and spirit of the invention.

What is claimed is:

1. A non-volatile semiconductor memory device, comprising:
    a memory cell array of electrically erasable programmable non-volatile memory cells arrayed at intersections of local word lines and local bit lines;
    a local row decoder configured to select one of the local word lines in accordance with an address signal; and
    a global row decoder configured to select one of global word lines, which is to be connected to the local row decoder, in accordance with an address signal,
    wherein the local row decoder includes
    a first MOS transistor of a first conductivity type having one end connected to the local word line, the other end supplied with a first voltage, and a gate connected to the global word line, and
    a second MOS transistor of a second conductivity type different from the first conductivity type having one end connected to the local word line, the other end supplied with a second voltage, and a gate connected to the global word line,
    wherein the global row decoder is capable of independently selecting either a first global word line or a second global word line such that one is selected while the other is not selected, the first global word line being connected to the first MOS transistor and the second MOS transistor both connected to any one of the local word lines, and the second global word line being connected to the first MOS transistor and the second MOS transistor both connected to another adjacent local word line.

2. The non-volatile semiconductor memory device according to claim 1, wherein the global row decoder includes
    a first decoder configured to select the global word lines with an odd number, and
    a second decoder configured to select the global word lines with an even number.

3. The non-volatile semiconductor memory device according to claim 2, wherein the first decoder and the second decoder receives an address signal and a control signal, the control signal being in a first condition when data erase is performed in the memory cell array, and being in a second condition in other cases.

4. The non-volatile semiconductor memory device according to claim 2, wherein the memory device is configured such that the first decoder applies a read voltage to the global word lines with an odd number while the second decoder applies a reference voltage to the global word lines with an even number, and that the second decoder applies a read voltage to the global word lines with a even number while the first decoder applies a reference voltage to the global word lines with an odd number.

5. The non-volatile semiconductor memory device according to claim 4, wherein the first decoder and the second decoder receives an address signal and a control signal, the control signal being in a first condition when data erase is performed in the memory cell array, and being in a second condition in other cases.

6. The non-volatile semiconductor memory device according to claim 1, further comprising
    a first block decoding wire connected to the first MOS transistor, and
    a second block decoding wire connected to the second MOS transistor,
    the second block decoding wire further comprising
    a first wire connected to the second MOS transistor connected to the global word line with an odd number, and
    a second wire connected to the second MOS transistor connected to the global word line with an even number.

7. The non-volatile semiconductor memory device according to claim 6, further comprising a block decoder switching the potential of the first wire and the second wire.

8. The non-volatile semiconductor memory device according to claim 6, wherein the global row decoder includes
    a first decoder configured to select the global word lines with an odd number, and
    a second decoder configured to select the global word lines with an even number.

9. The non-volatile semiconductor memory device according to claim 8, wherein the first decoder and the second decoder receives an address signal and a control signal, the control signal being in a first condition when data erase is performed in the memory cell array, and being in a second condition in other cases.

10. The non-volatile semiconductor memory device according to claim 1, wherein the memory cell array comprises a NOR-type flash memory including a plurality of cell transistors connected in parallel with the local bit line.

11. The non-volatile semiconductor memory device according to claim 1, further comprising a plurality of memory cores each including the memory cell array and the local row decoder,
    the plurality of memory cores being provided with the global row decoder respectively.

12. The non-volatile semiconductor memory device according to claim 11, wherein the memory cell array comprises a NOR-type flash memory including a plurality of cell transistors connected in parallel with the local bit line.

* * * * *